(12) United States Patent
Iwasaki et al.

(10) Patent No.: US 6,462,425 B1
(45) Date of Patent: Oct. 8, 2002

(54) SEMICONDUCTOR DEVICE AND MANUFACTURING METHOD THEREOF

(75) Inventors: Toshihiro Iwasaki; Masatoshi Yasunaga; Satoshi Yamada; Kozo Harada; Michitaka Kimura, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/429,635

(22) Filed: Oct. 29, 1999

(30) Foreign Application Priority Data

Apr. 19, 1999 (JP) ............................................. 11-110461

(51) Int. Cl.$^7$ ........................... H01L 29/40; H01L 23/29

(52) U.S. Cl. ........................ 257/780; 257/781; 257/795

(58) Field of Search ................................ 257/780, 781, 257/767, 787, 788, 789, 795, 687, 701

(56) References Cited

U.S. PATENT DOCUMENTS

| | | | | |
|---|---|---|---|---|
| 4,263,606 A | * | 4/1981 | Yorikane | 357/71 |
| 4,764,804 A | * | 8/1988 | Sahara et al. | 357/81 |
| 5,010,389 A | * | 4/1991 | Gansauge et al. | 357/67 |
| 5,422,435 A | * | 6/1995 | Takiar et al. | 257/777 |
| 5,633,535 A | * | 5/1997 | Chao et al. | 257/778 |
| 5,889,326 A | * | 3/1999 | Tanaka | 257/737 |
| 5,918,113 A | * | 6/1999 | Higashi et al. | 438/119 |
| 5,928,458 A | * | 7/1999 | Aschenbrenner et al. | 156/307.1 |
| 6,333,206 B1 | * | 12/2001 | Ito et al. | 257/687 |

FOREIGN PATENT DOCUMENTS

| JP | 63-311745 | 12/1988 |
|---|---|---|
| JP | 8-45990 | 2/1996 |

OTHER PUBLICATIONS

Fujita et al., "High–Reliability Epoxy Molding Compound for Surface Mount Device",43rd Elec. Components and Tech. Conf. Proceedings, pp. 735–741, Jun. 1–4, 1993.*
Ishibashi et al. "A New Anisotropic Conductive Film with Arrayed Conductive Particles", IEEE Trans. on Components, Packaging, and Manufacturing Tech. Part B: Advanced Packaging, pp. 752–757, Nov. 1996.*
Ito et al., "A Novel Flip Chip Technology Using Non–Conductive Resin Sheet", 48th IEEE Elec. Components & Technology Conf., pp. 1047–1051, May 25–28, 1998.*
Oguibe et al., "Flip–Chip Assembly using Anisotropic Conducting Adhesives: Experimental and Modelling Results", Proceedings of 3rd International Conf. on Adhesive Joining and Coating Tech. in Elec. Manu., pp. 27–33, Sep. 28–30, 1998.*
"A Study of a New Flip Chip Packaging Process for Diversified Bump and Land Combination", M. Mizutani et al., 0–7803–4526–6/98/$10.00 (c) 1998 IEEE.

* cited by examiner

Primary Examiner—Matthew Smith
Assistant Examiner—Lex H. Malsawma
(74) Attorney, Agent, or Firm—McDermott, Will & Emery (57) ABSTRACT

A semiconductor device allowing a mounting of a semiconductor substrate with narrow electrode pad interval on an insulated circuit board while securing a favorable insulation characteristic and a manufacturing method thereof are obtained. The semiconductor device includes an electrode pad formed on a semiconductor substrate; a connecting underlying metal film connected to the electrode pad; a connecting conductor establishing electrical conduction between the connecting underlying metal film and a terminal electrode on an insulated circuit board; and non-conductive resin surrounding the connecting conductor and filling a gap between the substrate and the insulated circuit board. Here, the connecting underlying metal film is not covered by the connecting conductor at least in a peripheral region including an outer peripheral portion thereof

14 Claims, 9 Drawing Sheets

SEMICONDUCTOR DEVICE AND MANUFACTURING METHOD THEREOF

BACKGROUND OF THE INVENTION

1. Field of the Invention

The present invention relates to a semiconductor device mounted on an insulated circuit board and a manufacturing method thereof. And more particularly the present invention relates to a semiconductor device having a connecting conductor with a shape limited in a joint portion in view of favorable insulation characteristics and a manufacturing method thereof.

2. Description of the Background Art

Figure 18:
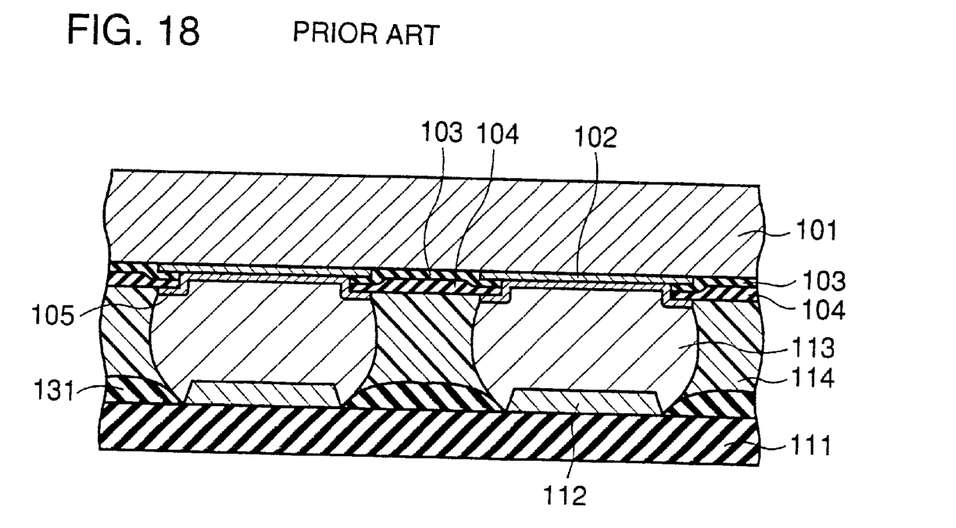
FIG. 18 shows a conventional semiconductor device.

FIG. 18 shows a typical example of a conventional semiconductor device mounted on an insulated circuit board. Among processes for forming the semiconductor device as shown in FIG. 18 by mounting a semiconductor substrate on the insulated circuit board, the following process is known. First, a semiconductor substrate 101 with a connecting underlying metal film 105 on an electrode pad 102 is prepared. Then the semiconductor substrate is aligned with an insulated circuit board 111 having a solder resist 131 and a connecting conductor 113 connected on to a terminal electrode 112, and the connecting underlying metal film is joined with the connecting conductor. At the mounting of the semiconductor substrate to the insulated circuit board, a gap between insulated circuit board 111 and semiconductor substrate 101 is filled and sealed with resin 114, after the connecting conductor is fused and joined with the connecting underlying metal film. A surface of the connecting underlying metal film of the semiconductor device mounted according to the above described process is completely covered with connecting conductor 113 that expands in a horizontal direction at the fusion due to its wettability. In other words, there is no region of the connecting underlying metal film not covered by the fused connecting conductor.

An interval between electrode pads has been shrinking with the progress in semiconductor device integration. In the semiconductor device with the above described structure, a favorable insulation characteristic is hard to secure because the connecting conductor is fused and expands onto the surface of the connecting underlying metal film due to its wettability and increases its diameter as shown in FIG. 18, thereby reducing the interval between connecting conductors. Even if the connecting conductor does not fuse nor expand as in the case of solid-state welding, the connecting conductor is compressed in the process and increases its diameter, possibly narrowing the interval between the electrode pads, thereby leading to the degradation of insulation characteristic.

SUMMARY OF THE INVENTION

An object of the present invention is, therefore, to provide a semiconductor device having a structure allowing mounting of a semiconductor substrate with a narrow electrode pad interval on an insulated circuit board while securely maintaining a favorable insulation characteristic and a manufacturing method thereof A semiconductor device according to the present invention includes: an electrode pad formed on a main surface of a semiconductor substrate; a protective insulation film covering the electrode pad and the main surface of the semiconductor substrate; a connecting underlying metal film connected to the electrode pad to cover an opening of the protective insulation film formed in a region corresponding to the electrode pad; a connecting conductor connecting an insulated circuit board and the semiconductor substrate to establish electrical conduction between a terminal electrode formed on the insulated circuit board and the connecting underlying metal film; and non-conductive resin surrounding the connecting conductor and filling a gap between the insulated circuit board and the semiconductor substrate; and the connecting underlying metal film is not covered by the connecting conductor at least in a region of a peripheral portion including an outer peripheral portion.

With the above structure, even when the interval between electrode pads decreases along with the advance of semiconductor device integration, the connecting conductor does not expand in a horizontal direction onto the connecting underlying metal film regardless of wettability.: Thus, the gap between the connecting conductors is securely filled by non-conductive resin. In addition, in the case of solid-state welding, where the connecting conductor does not fuse, the connecting conductor hardly increases its diameter due to the constraint by the non-conductive resin, even when a stress is applied in such a direction that the connecting conductor is compressed in a longitudinal direction thereof. Thus, a favorable insulation characteristic can be maintained. To be specific, both in the case of fusion and the solid-state welding, as the connecting conductor does not cover the peripheral portion of the connecting underlying metal film, it is impossible to increase the diameter of the connecting conductor above a certain level at an end portion thereof. When the diameter of the connecting conductor is decreased only in a portion in contact with the connecting underlying metal film, the shape described above cannot be obtained. The diameter of the connecting conductor must be smaller than a predetermined size along its entire length. In other words, the connecting conductor cannot be joined with the connecting underlying metal film without covering the peripheral portion of the connecting underlying metal film unless the diameter of the connecting conductor is decreased to become smaller than the predetermined size, along its entire length. The above described effect can be obtained as far as an area of the connecting underlying metal film is larger than a sectional area of the end portion of the connecting conductor, for example, when the area of the connecting underlying metal film is made larger so that it contains the diameter of the end portion of the connecting conductor with a sufficient margin to accommodate the shift in alignment of the connecting conductor and the connecting underlying metal film, or when the size of the connecting conductor and the connecting underlying metal film bear different relations.

Therefore even in a highly integrated semiconductor device, insulation failure will not occur in the joint portion mentioned above, whereby improved production yield and reduced manufacturing cost can be obtained. Here, the above described connecting underlying metal film is formed only for the purpose of electrical conduction (joining, or connection prior to the joining) with the connecting conductor, and is not intended for wiring, test pads or the like.

In the semiconductor device described above, preferably a portion of the connecting underlying metal film covered by the connecting conductor is limited to a portion in a region corresponding to the opening formed in the protective insulation film, and a portion surrounding the portion is not covered by the connecting conductor.

With the above described structure, as the joint portion is limited to a portion in a region corresponding to the opening, the semiconductor substrate can be mounted while securely maintaining a favorable insulation characteristic, even in a still more highly integrated semiconductor device.

In addition, in some cases, in the semiconductor device described above, desirably the portion of the connecting underlying metal film covered by the connecting conductor is limited to a portion of the connecting underlying metal film including the region corresponding to the opening formed in the protective insulation film, and a portion surrounding the portion is not covered by the connecting conductor.

Depending on the use of the semiconductor device, in some cases a large joint portion is preferable. In such case, with the above described structure of joint portion, the area of joint portion can be made larger while securely maintaining a favorable insulation characteristic.

In the semiconductor device described above, desirably the region of the connecting underlying metal film corresponding to the opening is depressed to a side of the semiconductor substrate, and a step is formed between the region corresponding to the opening and a region surrounding the region corresponding to the opening.

When the joint portion is limited to a portion in a region corresponding to the opening, the above mentioned step further selves to strictly limit the expansion of joint portion of the connecting conductor. Hence the favorable insulation characteristic is easily secured. In addition, when the joint portion is limited to a region including the region corresponding to the opening, the depression, though partially, limits the joint portion, hence, favorable insulation characteristic is more easily secured.

In the semiconductor device described above, desirably, the connecting conductor is mainly comprised of two portions with different plane shapes on a cross-section plane parallel to the insulated circuit board, and a portion with a plane shape of a small area is arranged adjacent to the connecting underlying metal film.

With the above described shape of the connecting conductor, the joint portion can be limited to a still smaller region in the region corresponding to the opening of the connecting underlying metal film. Hence, the interval between connecting conductors can be securely maintained even with the higher integration of semiconductor device with narrower electrode pad interval.

At the joining in the mounting as described above, the portion of the connecting conductor with a small sectional area is usually joined as the joint portion. This configuration is adopted partially because the pressure at the joining can be easily increased, and the non-conductive resin can be easily pushed away from the joint portion. Hence, a portion with a large sectional area is previously connected onto the semiconductor substrate or the insulated circuit board.

When the connecting conductor is formed on the connecting underlying metal film of the semiconductor substrate, and the terminal electrode of the insulated circuit board is joined with the connecting conductor, or in other cases, in the semiconductor device according to the present invention as described above, desirably the connecting conductor is mainly constituted of two portions with different plane shapes on a cross-section plane parallel to the insulated circuit board, and a portion with large plane area is arranged adjacent to the connecting underlying metal film.

Thus in the step of forming the connecting conductor on the connecting underlying metal film, expansion of the connecting conductor due to its wettability does not occur. Therefore with the connecting conductor with the shape as described above, the joint portion between the terminal electrode and the connecting conductor can be formed in a small limited region at the joining during the mounting of the semiconductor device. In other words, when the non-conductive resin has been applied on the insulated circuit board, the connecting conductor pushes away the non-conductive resin in a small portion at the joining with the terminal electrode. When the non-conductive resin has been layered on the side of the semiconductor substrate, the non-conductive resin that often remains between the terminal electrode and the connecting conductor is removed and joining can be achieved. These elements are joined after the non-conductive resin is applied to limit the expansion of the connecting conductor. As a result, a favorable insulation characteristic of the joint portion can be securely maintained even in a highly integrated semiconductor device.

In the semiconductor device as described above, desirably, the insulated circuit board further includes a solder resist with an opening formed therein to allow electrical connection between the terminal electrode and the connecting conductor.

With the solder resist mentioned above, the shape of the connecting conductor in the proximity of the joint portion between the terminal electrode and the connecting conductor can be further limited from outside. Therefore, still higher integration can be achieved while securely maintaining the favorable insulation characteristic of the joint portion. In addition, with the insertion of the solder resist, the non-conductive resin and the insulated circuit board are adhered to each other more firmly and improvement in yield and reliability can be attained.

In the semiconductor device as described above, the non-conductive resin includes fillers and the fillers are at most 1 $\mu$m in an average diameter or 5 $\mu$m in maximum diameter.

With the inclusion of fillers, coefficient of thermal expansion of the non-conductive resin, which is generally extremely high, can be made equal to that of the semiconductor substrate of silicon or the like. In addition, the strength of the non-conductive resin can be improved. In addition, water absorption ratio can be reduced. With such improvement in properties of the non-conductive resin, even when the non-conductive resin is inserted, the reliability of the joint portion between the connecting underlying metal film and the connecting conductor can be secured by using the fillers with the diameter in the above mentioned range.

In the semiconductor device as described above, all fillers included in the non-conductive resin are spherical.

When filler is spherical, even if the non-conductive resin is applied, the fillers are hardly caught between the connecting underlying metal film and the connecting conductor at the mounting of the semiconductor device. In addition, even if the filler is caught therebetween, concentration of stress thereon rarely occurs, whereby the damage on the joint portion attributable to stress is hardly produced.

In the semiconductor device described above under a given condition, preferably in an interface between the connecting underlying metal film and the connecting conductor, fillers are included in a peripheral region including the interface between the connecting underlying metal film and the connecting conductor but not in the connecting underlying metal film.

As the connecting conductor is in contact with and surrounded by the non-conductive resin, the fillers move to the interface between the connecting underlying metal film and the connecting conductor, and a certain amount of fillers enter into the peripheral portion near the interface of the connecting conductor at the joining. Still, even in such case, the insulation characteristic between connecting conductors can be maintained because of the constraint by the non-conductive resin. Similarly, when a step is performed for joining the connecting conductor with the terminal electrode on the insulated circuit board, with the non-conductive resin applied thereon and placed between the terminal electrode and the connecting conductor, fillers again enter into the connecting conductor. Even in this case, the favorable insulation characteristic between the connecting conductors can be maintained according to the same reason as described above. As a result, wide variation in manufacturing processes and hence the reduction in manufacturing cost is allowed. Still further, even when a low-melting material, such as solder is employed for the connecting conductor, the formation of solder resist film on the insulated circuit board is not necessary, whereby cost saving is possible.

The semiconductor device as described above is desirably covered with a transfer mold.

As a result, the semiconductor substrate can be handled without being damaged, whereby yield and reliability can be improved.

In the semiconductor device as described above, a material of the connecting conductor is preferably a material selected from the group consisting of solder, Au, Ag, Cu, Al, Bi, Zn, Sb, In, Pb, Si, and an alloy thereof.

With the connecting conductor of the materials listed above, the joining can be achieved in relatively low temperature range without increasing electrical resistance. Here, above mentioned "an alloy thereof" may includes an element not listed above as far as the alloy includes more than one of solder, Au, Ag, Cu, Al, Bi, Zn, Sb, In, Pd and Si.

A method of manufacturing a semiconductor device according to the present invention includes the steps of: forming an electrode pad on a main surface of a semiconductor substrate; forming a protective insulation film on the electrode pad and the main surface; forming an opening in the protective insulation film in a region corresponding to the electrode pad; forming a connecting underlying metal film connected to the electrode pad, on the protective insulation film so as to fill the opening; forming a terminal electrode on an insulated circuit board; and establishing electrical conduction between the connecting underlying metal film formed on the semiconductor substrate and the terminal electrode formed on the insulated circuit board; wherein in the step of establishing electrical conduction, a connecting conductor establishing electrical conduction between the terminal electrode formed on the insulated circuit board and the connecting underlying metal film formed on the semiconductor substrate is joined while being in contact with and surrounded by non-conductive resin at least in a portion to be joined, thereby establishing electrical conduction between the terminal electrode and the connecting underlying metal film.

Thus, the connecting conductor does not expand nor increase its diameter regardless of its wettability on the connecting underlying metal film at the joining. In addition, in the case of the solid-state welding where the connecting conductor does not fuse, even if a stress is applied in such a direction that the connecting conductor is compressed in a longitudinal direction thereof, the diameter hardly increases because of the constraint by the non-conductive resin. Hence the favorable insulation characteristic is maintained. Both in the case of fusion and the solid-state welding, as the connecting conductor does not cover the peripheral portion of the connecting underlying metal film, it is impossible to increase the diameter of the connecting conductor above a certain level at an end portion thereof. When the diameter of the connecting conductor is decreased only in a portion in contact with the connecting underlying metal film, the shape described above cannot be obtained. The diameter of the connecting conductor must be smaller than a predetermined size along its entire length. The above described effect can be obtained as far as an area of the connecting underlying metal film is larger than a sectional area of the end portion of the connecting conductor, for example, when the area of the connecting underlying metal film is made larger so that it contains the diameter of the end portion of the connecting conductor with a sufficient margin to accommodate the shift in alignment of the connecting conductor and the connecting underlying metal film.

As a result, the favorable insulation characteristic can be securely maintained even in the more highly integrated device with narrower pitch of electrode pads.

The method of manufacturing the semiconductor device as described above includes the steps of: connecting one end of the connecting conductor to the terminal electrode formed on the insulated circuit board prior to the step of establishing electrical conduction; and applying the non-conductive resin on the insulated circuit board connected to the connecting conductor such that the non-conductive resin contacts with and surrounds the connecting conductor; and in the step of establishing electrical conduction, desirably another end of the connecting conductor is joined to the connecting underlying metal film formed on the semiconductor substrate, with non-conductive resin being in contact with and surrounding the connecting conductor.

In the above described method, as the connecting conductor is bonded and the non-conductive resin is applied by pressure to the insulated circuit board with a relatively simple structure, highly integrated semiconductor device can be manufactured without degrading the insulation characteristic, whereby high reliability and production yield are secured.

The method of manufacturing the semiconductor device as described above includes under a certain condition, the steps of: connecting one end of the connecting conductor to the connecting underlying metal film formed on the semiconductor substrate prior to the step of establishing electrical conduction; and applying the non-conductive resin on the semiconductor substrate connected to the connecting conductor such that the non-conductive resin contacts with and surrounds the connecting conductor; and in the step of establishing electrical conduction, desirably another end of the connecting conductor is joined to the terminal electrode formed on the insulated circuit board, with non-conductive resin being in contact with and surrounding the connecting conductor.

In some cases, depending on the production line or other factors, it is more efficient to form the connecting conductor on the semiconductor substrate. In such a case, efficiency improvement can be achieved by employing the above described method.

The method of manufacturing the semiconductor device as described above includes under another condition, the steps of: connecting one end of the connecting conductor to the terminal electrode formed on the insulated circuit board prior to the step of establishing electrical conduction; and forming a layer of the non-conductive resin on the semiconductor substrate having the connecting underlying metal film formed thereon; and in the step of establishing electrical conduction, desirably another end to be joined of the connecting conductor is joined to the connecting underlying metal film formed on the semiconductor substrate pushing away the non-conductive resin while being in contact with and surrounded by the non-conductive resin.

With the above described method, the semiconductor device mounted on the insulated circuit board having a joint portion with a good insulation characteristic can be efficiently manufactured under another condition.

Under still another condition, the method of manufacturing the semiconductor device described above includes the steps of: connecting one end of the connecting conductor to the connecting underlying film formed on the semiconductor substrate prior to the step of establishing electrical conduction; and forming a layer of the non-conductive resin on the insulated circuit board having the terminal electrode formed thereon; and in the step of establishing electrical conduction, desirably another end to be joined of the connecting conductor is joined to the terminal electrode formed on the insulated circuit board pushing away the non-conductive resin while being in contact with and surrounded by the non-conductive resin.

As a result, the semiconductor device with a good insulation characteristic can be efficiently manufactured under still another condition described above.

Under still another condition, the method of manufacturing the semiconductor device as described above includes the steps of: forming a layer of the non-conductive resin to cover the insulated circuit board; forming an opening in the layer of the non-conductive resin in a region corresponding to the terminal electrode; and forming the-connecting conductor in the opening of the layer of the non-conductive resin by deposition technique; and in the step of establishing electrical conduction, desirably an end of the connecting conductor of the insulated circuit board is joined to the connecting underlying metal film of the semiconductor substrate.

As a result, by performing the above described process steps and employing the insulated circuit board with the connecting conductor and non-conductive resin applied thereto, the semiconductor device mounted on the insulated circuit board having a joint portion with a good insulation characteristic can be efficiently manufactured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

With reference to the drawings, the preferred embodiments of the present invention will be described.

First Embodiment

Figure 1:
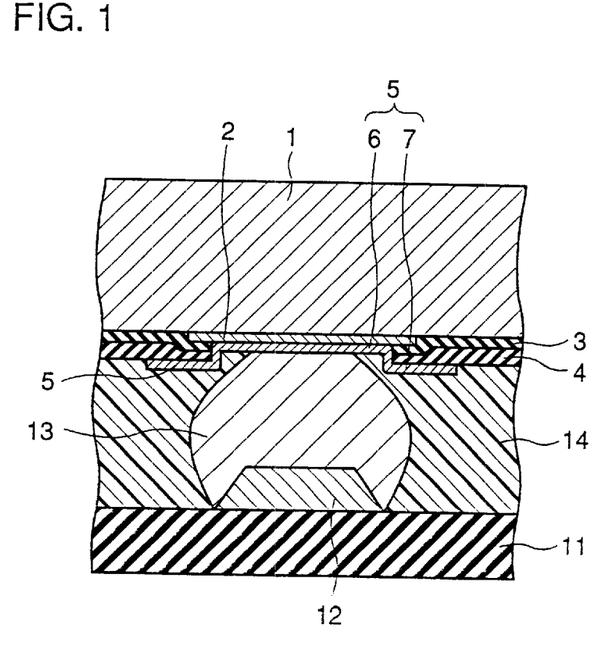
FIG. 1 is a sectional view of a part including a joint portion of one semiconductor device according to the first embodiment.
Figure 2:
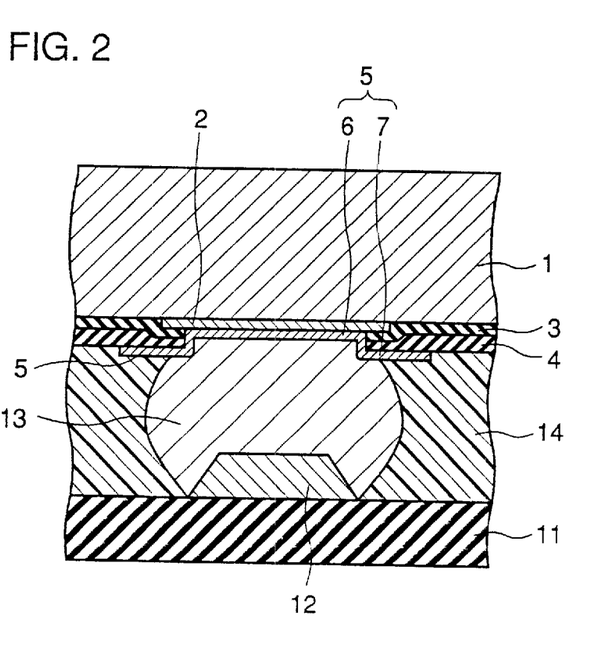
FIG. 2 is a sectional view of a part including a joint portion of another semiconductor device according to the first embodiment.

With reference to FIGS. 1 and 2, in a semiconductor device, a semiconductor substrate 1 has protective insulation films 3 and 4 with an opening 16 (see FIG. 8) formed in a portion of an electrode pad 2 and a connecting underlying metal film 5 larger than and covering the opening, and establishes electrical conduction to a terminal electrode 12 of an insulated circuit board 11 via a lump-shaped connecting conductor 13. A gap between semiconductor substrate 1 and insulated circuit board 11 is filled with non-conductive resin 14. Here, a single crystal silicon substrate is employed as the semiconductor substrate. In the semiconductor device shown in FIG. 1, a portion of connecting underlying metal film 5 is not in contact with connecting conductor 13 in a region 6 corresponding to opening 16. In the semiconductor device shown in FIG. 2, a portion of connecting underlying metal film 5 is not in contact with connecting conductor 13 in a region 7 of the connecting underlying metal film outside the opening.

In the above described semiconductor device, the connecting conductor does not expand in horizontal direction regardless of its wettability at the joining for mounting. In addition, in the case of solid-state welding, where the connecting conductor does not fuse, due to the constraint by the non-conductive resin, the connecting conductor hardly expands in a horizontal direction even when a stress is applied in such a direction that the connecting conductor is compressed in a longitudinal direction thereof Thus, a favorable insulation characteristic can be maintained. Both in the case of fusion and the solid-state welding, it is impossible to increase the diameter of the connecting conductor above a certain level at an end portion thereof, because the connecting conductor does not cover the peripheral portion of the connecting underlying metal film. When the diameter of the connecting conductor is decreased only in a portion in contact with the connecting underlying metal film, the shape described above cannot be obtained. The diameter of the connecting conductor must be smaller than a predetermined size along its entire length. In other words, the connecting conductor cannot be joined with the connecting underlying metal film without covering the peripheral portion of the connecting underlying metal film unless the diameter of the connecting conductor is decreased and becomes smaller than the predetermined size along its entire length. The above described effect can be obtained as far as an area of the connecting underlying metal film is larger than a sectional area of the end portion of the connecting conductor, for example, when the area of the connecting underlying metal film is made larger so that it contains the diameter of the end portion of the connecting conductor with a sufficient margin to accommodate the shift in alignment of the connecting conductor and the connecting underlying metal film, or when the sizes of the connecting conductor and the connecting underlying metal film bear different relations.

As a result, every interval between connecting conductors is maintained wide, whereby the insulation characteristic between the connecting conductors is improved and reliability of the semiconductor device is securely improved.

The semiconductor device described above is manufactured in the following method.

Figure 3:
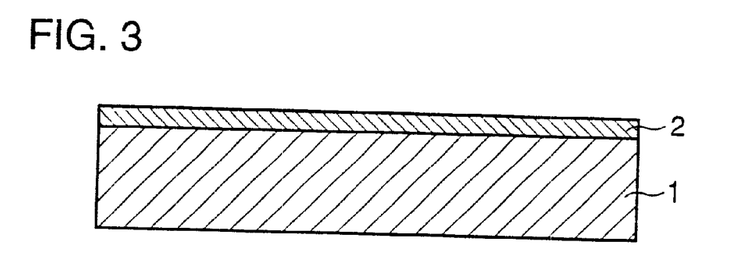
FIG. 3 shows a structure of the semiconductor device according to the first embodiment after a deposition of a metal film for an electrode pad.
Figure 4:
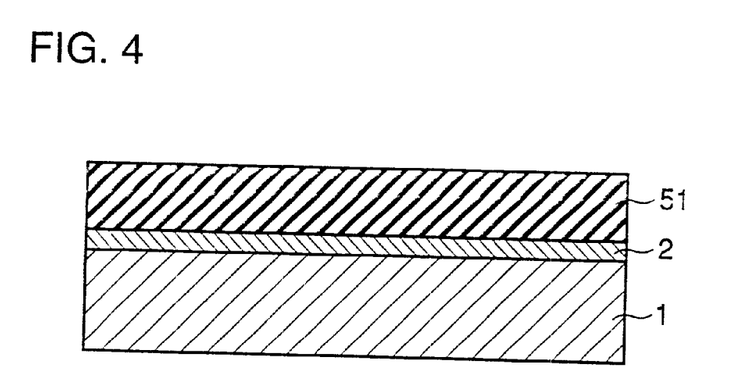
FIG. 4 shows a structure after resist film application.
Figure 5:
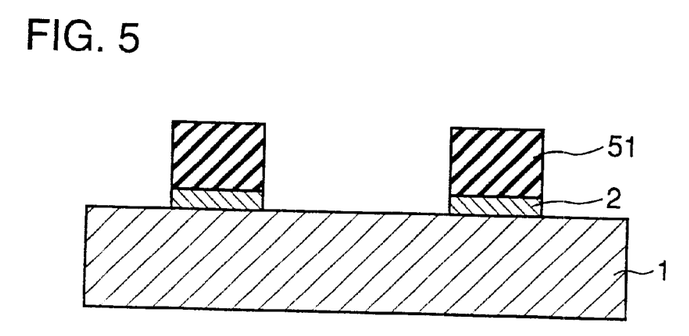
FIG. 5 shows a structure after a metal film for electrode pad is etched.

First, as shown in FIG. 3, a metal film 2 which is to be an electrode pad is deposited on a semiconductor substrate 1 through CVD (Chemical Vapor Deposition) method. Then a resist 51 is applied on the structure shown in FIG. 3 by a spin coater (FIG. 4). After electrode pad 2 is formed through exposure and etching as shown in FIG. 5, the resist is removed (FIG. 6).

Figure 6:
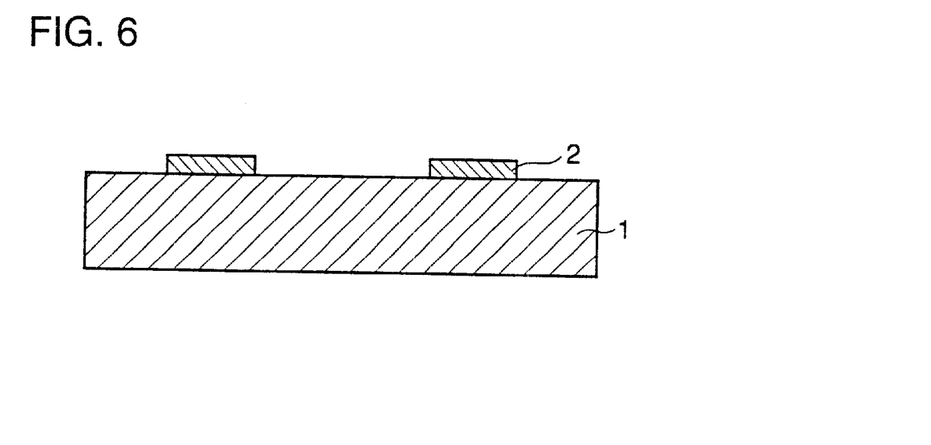
FIG. 6 shows a structure after removal of a resist.
Figure 7:
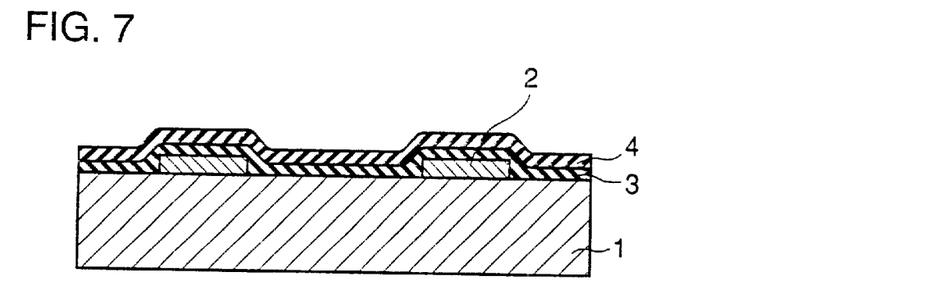
FIG. 7 shows a structure after application of a glass coat and a photosensitive polyimide film forming a protective insulation film.
Figure 8:
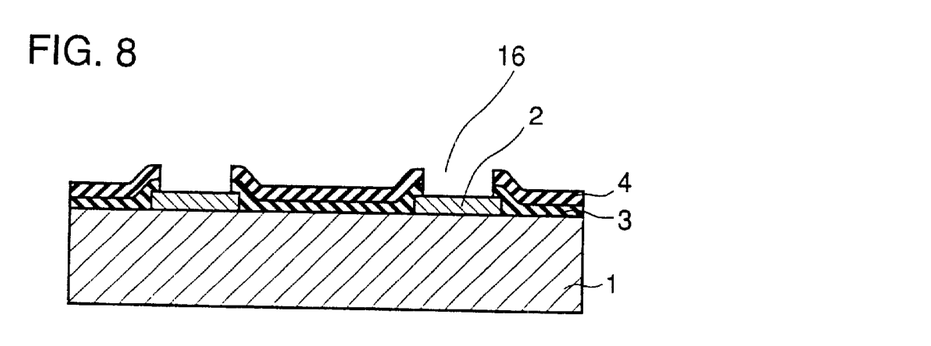
FIG. 8 shows a structure after a protective insulation film is etched.
Figure 9:
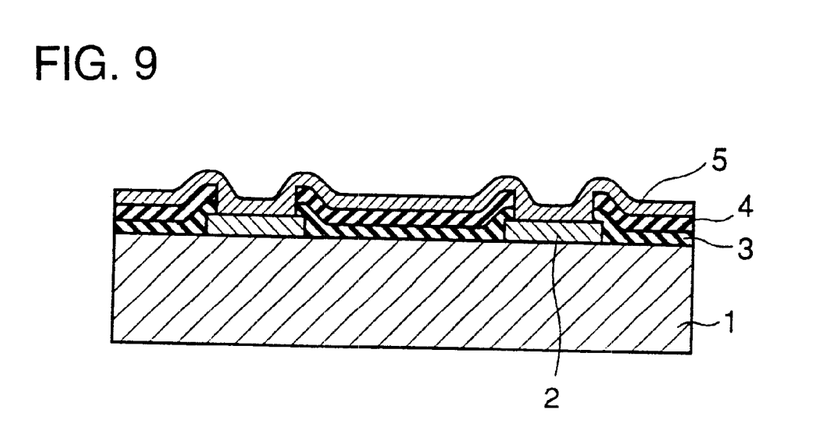
FIG. 9 shows a structure after a connecting underlying metal film is formed on the structure shown in FIG. 8.
Figure 10:
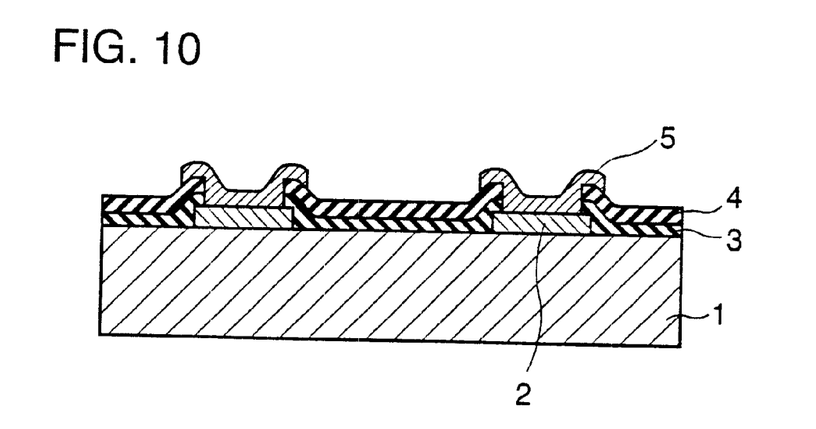
FIG. 10 shows a structure after a connecting underlying metal film is etched.

Then, a glass coat 3 is formed on the structure of FIG. 6 through CVD method and a photosensitive polyimide film 4 is applied by a spin coater thereon, forming a protective insulation film (FIG. 7). Thereafter, as shown in FIG. 8, an opening 16 is formed in the protective insulation film through exposure and dry etching. Further on the structure of FIG. 8, a connecting underlying metal film layer 5 is deposited through PVD technique (FIG. 9). After the formation of a resist on the structure of FIG. 9, exposure and etching are performed and connecting underlying metal film 5 is formed as shown in FIG. 10.

This is the process of manufacturing the semiconductor substrate. Next the process for manufacturing the insulated circuit board will be described.

First, an electrode layer of a metal film to form a terminal electrode is formed on the insulated circuit board through a laminating method or a plating method. Then, a resist is formed on this structure and exposed and etched. Then the metal film is plated to facilitate the bonding of the terminal electrode to the connecting conductor. Thus the terminal electrode is formed. On the terminal electrode, the connecting conductor is bonded. Then, non-conductive resin is applied to cover a surface of the substrate, the connecting conductor except its upper surface, an end of the terminal electrode, and so on. Thus the insulated circuit board is finished.

Figure 11A:
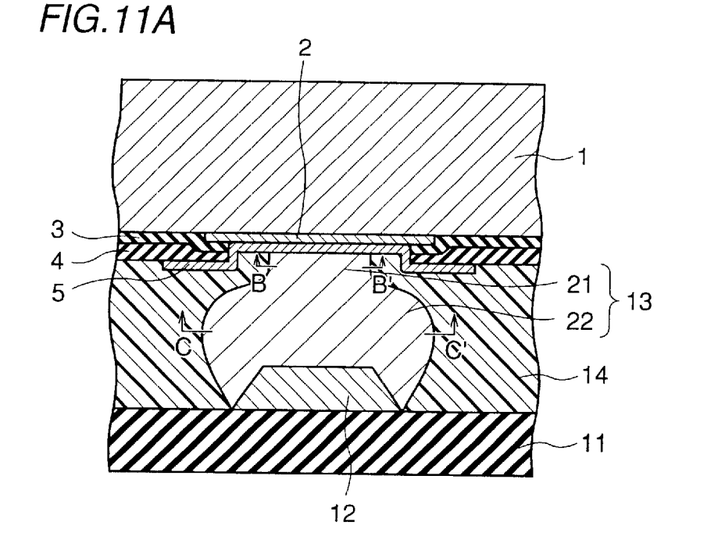
FIG. 11A is a sectional view of a part including a joint portion of a still another semiconductor device according to the first embodiment.
Figure 11B:
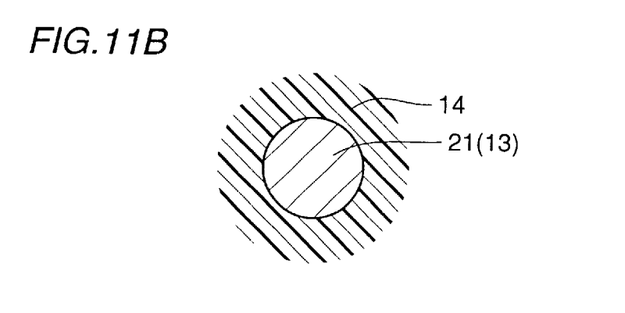
FIGS. 11B and 11C are cross sectional views of the structure shown in FIG. 11A.
Figure 11C:
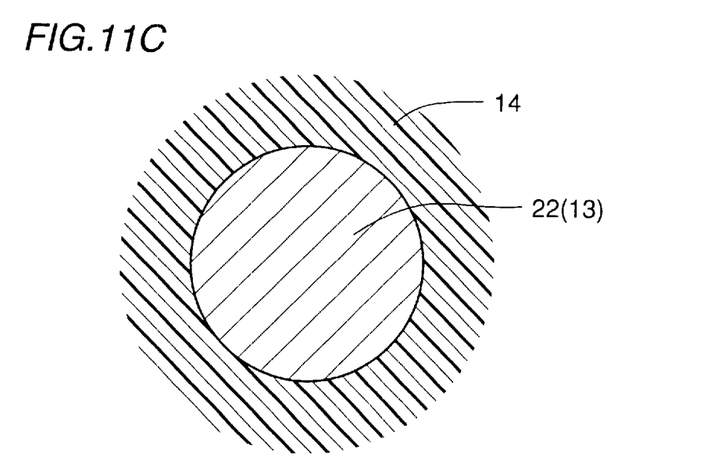

As the connecting conductor, solder, Au, or the like can be employed. As shown in FIG. 11, the shape of the connecting conductor is constituted of two portions distinguished by the size of its sectional area. Desirably a portion with a large sectional area is formed on the side of the insulated circuit board prior to the joining and a portion with a small sectional area is arranged at the side of the connecting underlying metal film. As described above, in some cases, the connecting conductor and further: the nonconductive resin may be formed at the side of the semiconductor substrate. Especially, when the portion with a small sectional area is arranged on the side of the connecting underlying metal film, the non-conductive resin can be prevented from being left between the connecting underlying metal film and the connecting conductor (which is often the case with other configurations) and whereby an exposed portion of an upper end of the connecting conductor not covered by the non-conductive resin before the joining can be made larger. As a result, the connecting underlying metal film and the connecting conductor can be easily joined, and improvement in yield, reliability and so on can be attained.

In the semiconductor device as described above, the non-conductive resin desirably includes fillers with average diameter of at most 1 $\mu$m or with maximum diameter of 5 $\mu$m. With fillers of such diameter, coefficient of thermal expansion is made equal to that of a silicon semiconductor substrate of silicon or the like and strength is also increased. Therefore, even if the non-conductive resin is placed, the reliability of the joint portion between the connecting underlying metal film and the connecting conductor will not be degraded. In addition, desirably fillers have a spherical shape in order to prevent the fillers from being caught between the connecting underlying metal film and the connecting conductor at the mounting of the semiconductor substrate. This shape also serves to prevent the concentration of stress even when fillers are caught.

Second Embodiment

Figure 12A:
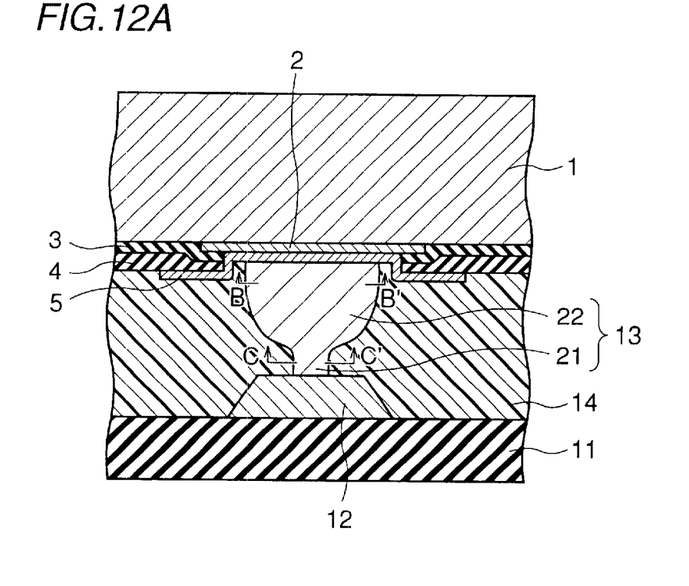
FIG. 12A is a sectional view of a semiconductor device according to a second embodiment.
Figure 12B:
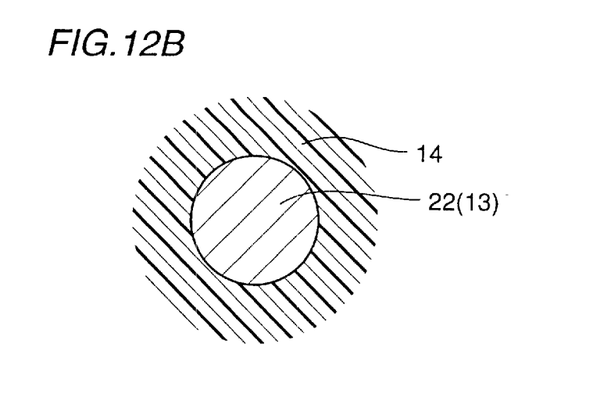
FIGS. 12B and 12C are cross sectional view of the structure illustrated in FIG. 12B.
Figure 12C:
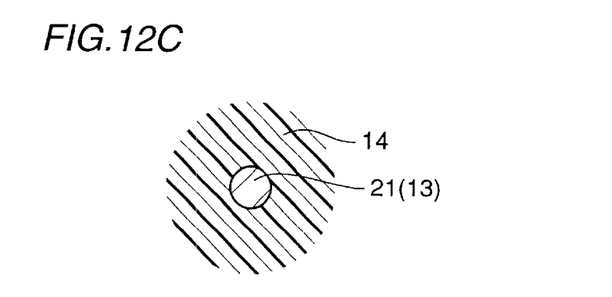

In FIG. 12, a portion 22 with a large sectional area of connecting conductor 13 is in contact with connecting underlying metal film 5 and a portion 21 with a small sectional area is connected to terminal electrode 12. In the semiconductor device with the structure as described above, preferably connecting conductor 13 has been previously bonded to connecting underlying metal film 5 on the side of the semiconductor substrate.

The method of manufacturing the semiconductor device as shown in FIG. 12 will be described. The manufacturing process of the semiconductor substrate is same with that of the first embodiment up to the step described in FIG. 10 where the connecting underlying metal film has been formed. Thereafter, the connecting conductor of solder or the like is bonded onto connecting underlying metal film 5. Preferably the connecting conductor which is mainly constituted of two portions distinguished by the size of sectional area may be employed. In this case the portion. with a large sectional area is bonded onto the connecting underlying metal film. Then, non-conductive resin 14 is applied by pressure on to protective insulation film 4 and a portion of the connecting underlying metal film so as to cover the peripheral portion of the connecting underlying metal film.

On the other hand, the insulated circuit board employed is of the structure after the terminal electrode formation. Thereafter, connecting conductor 13 on the semiconductor substrate is aligned with terminal electrode 12 on the insulated circuit board and these two portions are joined.

When the semiconductor device is of the structure as described above, various manufacturing processes can be employed. This structure can be employed when it is more efficient to form the connecting conductor and the non-conductive resin on the semiconductor substrate. In such case, it is obvious that this structure is preferable for maintaining the insulation characteristic in a highly integrated semiconductor device with narrower interval between electrode pads.

Here, though the case in which the non-conductive resin is applied on the semiconductor substrate is described, non-conductive resin can also be applied on the insulated circuit board by forming the connecting conductor alone on the semiconductor substrate and making an upper end portion of the connecting conductor push away the non-conductive resin at the joining of the connecting conductor to the terminal electrode.

Third Embodiment

Figure 13:
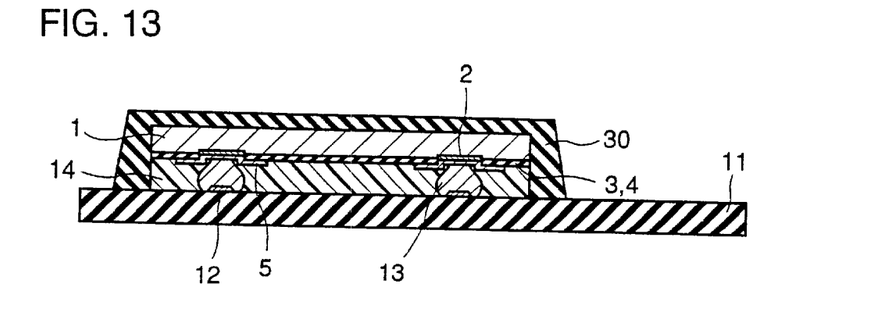
FIG. 13 is a sectional view of a semiconductor device according to a third embodiment covered with a transfer mold.
Figure 14:
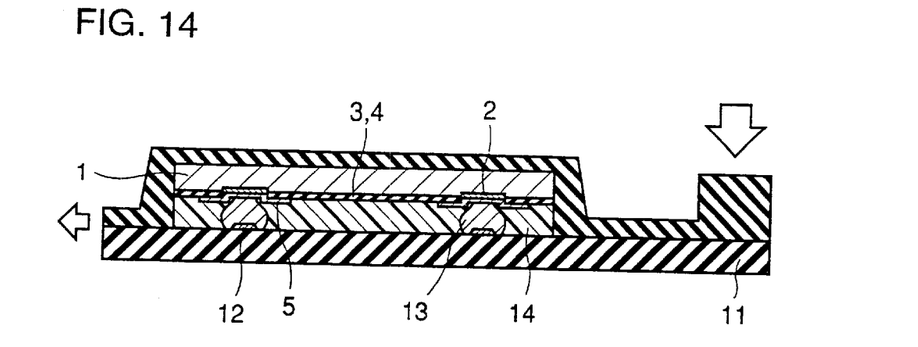
FIG. 14 is a view referenced for describing a process of coating by a transfer mold.

With reference to FIG. 13, a semiconductor device according to the third embodiment is a variation of the semiconductor device according to the first embodiment coated further by a transfer mold. High temperature and high pressure are applied to epoxy resin and the resin is extruded by an injection molding device as shown in FIG. 14 and an unnecessary portion is cut off. Thus the structure shown in FIG. 13 is formed. Thereafter a cut surface is shaped by post bake.

By coating the device with a transfer mold 30 as described above, the semiconductor device can be handled without damaging the semiconductor substrate at the manufacture, test, and transfer of the device in factories, and further improvement in yield and reliability can be attained.

Fourth Embodiment

Figure 15:
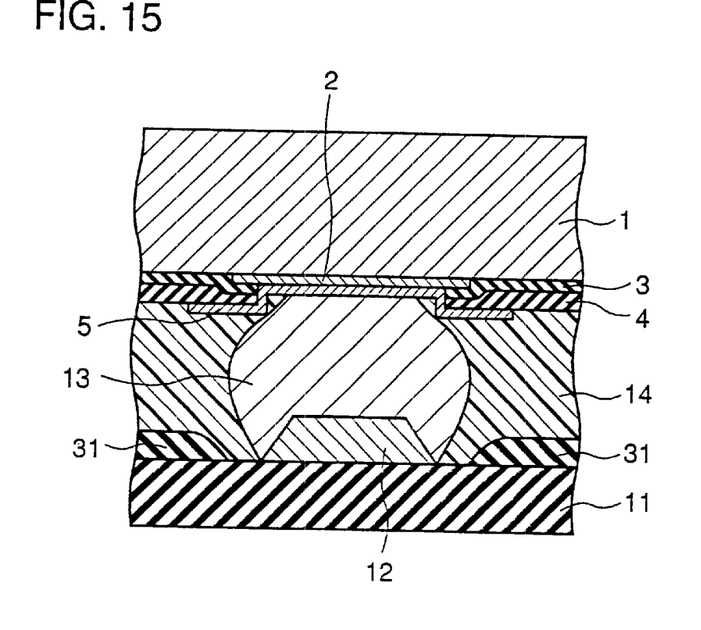
FIG. 15 is a sectional view of a semiconductor device according to a fourth embodiment provided with a solder resist.
Figure 16:
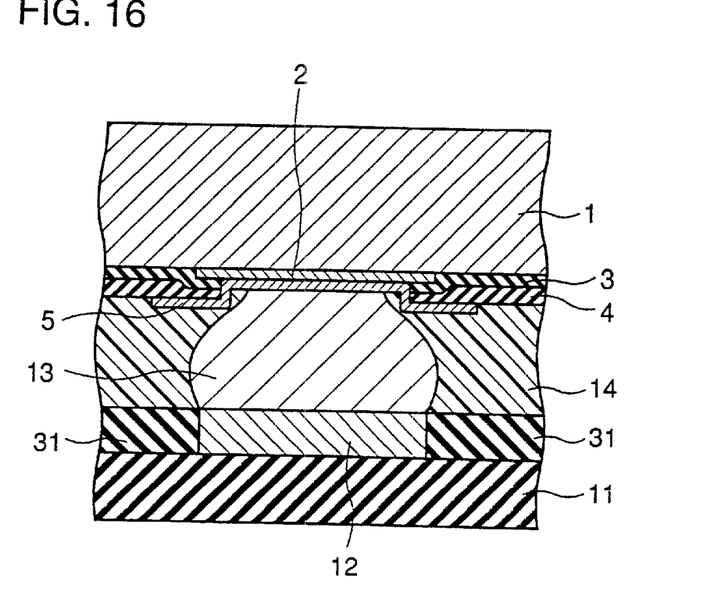
FIG. 16 is a sectional view of a semiconductor device according to a fourth embodiment provided with another solder resist.

With reference to FIGS. 15 and 16, a semiconductor device according to the fourth embodiment includes the insulated circuit board with a solder resist 31 having an opening to allow the connection between the terminal electrode and the connecting conductor. The shape of solder resist is different from FIG. 15 to FIG. 16. The solder resist shown in FIG. 16 is more effective in constraining the non-conductive resin. With this structure, the shape of the connecting conductor formed on the terminal electrode can be further limited. In addition, the connecting electrode is adhered to the non-conductive resin more firmly, resulting in improvement in yield and reliability.

Fifth Embodiment

Figure 17:
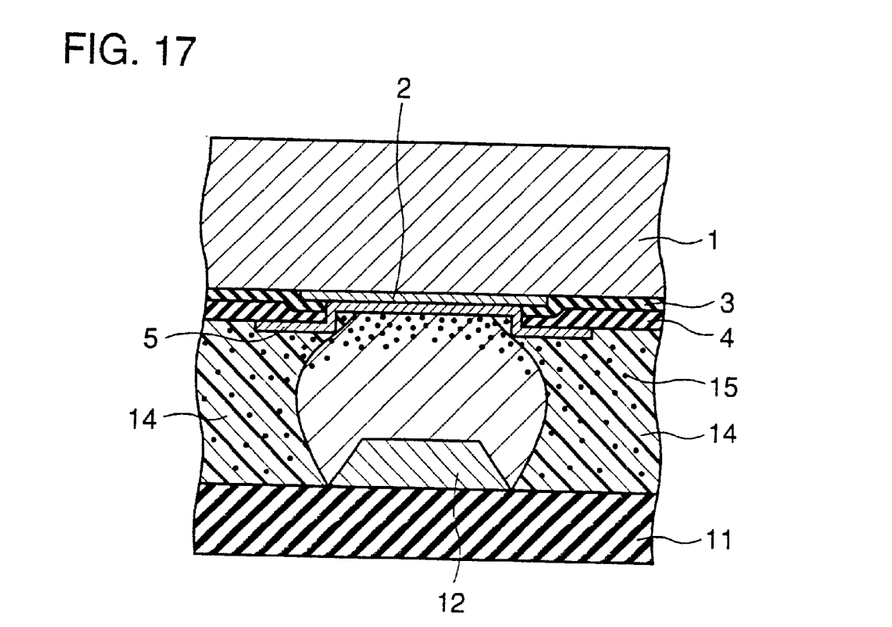
FIG. 17 is a sectional view of a semiconductor device according to a fifth embodiment including fillers around a joint portion.

With reference to FIG. 17, in the semiconductor device according to the fifth embodiment, fillers 15 are included at an interface between the connecting underlying metal film and the connecting conductor, or, in the connecting conductor in the proximity of the connecting underlying metal film. At the mounting of the semiconductor substrate to the insulated circuit board, a certain amount of fillers may and desirably be caught in the interface between the connecting underlying metal film and the connecting conductor, or a certain amount of fillers may and desirably come to be included in the connecting conductor in the proximity of the connecting underlying metal film, as the connecting conductor fuses and is joined like a solder as required. As the gap between the semiconductor substrate and the insulated circuit board is previously filled with the non-conductive resin as in the first embodiment, the insulation between the connecting conductors is maintained and the semiconductor device with high reliability can be obtained. In addition, even when a low-melting point material is employed as a material for the connecting conductor, formation of resist film on the insulated circuit board is not necessary and cost can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    an electrode pad formed on a main surface of a semiconductor substrate;
    a protective insulation film covering said electrode pad and the main surface of the semiconductor substrate;
    a connecting underlying metal film connected to said electrode pad to cover an opening of said protective insulation film formed in a region corresponding to said electrode pad;
    a connecting conductor connecting an insulated circuit board and the semiconductor substrate to establish electrical conduction between a terminal electrode formed on said insulated circuit board and said connecting underlying metal film; and
    non-conducive resin surrounding said connecting conductor and filing a gap between said insulated circuit board and the semiconductor substrate;
    wherein
        said connecting conductor is formed of a single material and
        said connecting underlying metal film is not covered by said connecting conductor at least in a region of a peripheral portion including an outer peripheral portion.

2. The semiconductor device according to claim 1, wherein a portion of the connecting underlying metal film covered by said connecting conductor is limited to a portion in a region corresponding to the opening formed in said protective insulation film, and a portion surrounding said portion is not covered by said connecting conductor.

3. The semiconductor device according to claim 2, wherein the region of said connecting underlying metal film corresponding to the opening is depressed to a side of the semiconductor substrate, and a step is formed between the region corresponding to the opening and a region surrounding the region corresponding to the opening.

4. The semiconductor device according to claim 1, wherein a portion of the connecting underlying metal film covered by said connecting conductor is limited to a portion of the connecting underlying metal film including a region corresponding to the opening formed in said protective insulation film, and a portion surrounding said portion is not covered by said connecting conductor.

5. The semiconductor device according to claim 4, wherein the region of said connecting underlying metal film corresponding to the opening is depressed to a side of the semiconductor substrate, and a step is formed between the region corresponding to the opening and a region surrounding the region corresponding to the opening.

6. The semiconductor device according to claim 1, wherein said connecting conductor is mainly constituted of two portions with different sectional area parallel to the insulated circuit board, and a portion with a small sectional area is arranged adjacent to said connecting underlying metal film.

7. The semiconductor device according to claim 1, wherein said connecting conductor is mainly constituted of two portions with different sectional area parallel to the insulated circuit board, and a portion with a large sectional area is arranged adjacent to said connecting underlying metal film.

8. The semiconductor device according to claim 1, wherein said insulated circuit board further includes a solder resist with an opening formed therein to allow electrical connection between said terminal electrode and said connecting conductor.

9. The semiconductor device according to claim 1, wherein said non-conductive resin includes fillers and the fillers are at most 1 µm in an average diameter or 5 µm in maximum diameter.

10. The semiconductor device according to claim 9, wherein all fillers included in said non-conductive resin are spherical.

11. The semiconductor device according to claim 1, wherein in an interface between said connecting underlying metal film and said connecting conductor, fillers are included in a peripheral region including the interface between said connecting underlying metal film and the connecting conductor but not in the connecting underlying metal film.

12. The semiconductor device according to claim 1 covered by a transfer mold.

13. The semiconductor device according to claim 1, wherein a material of said connecting conductor is a material selected from the group consisting of solder, Au, Ag, Cu, Al, Bi, Zn, Sb, In, Pd, Si, and an alloy thereof.

14. The semiconductor device according to claim 1, wherein said connecting conductor is joined to the connecting underlying metal film pushing away said non-conductive resin while being in contact with and surrounded by said non-conductive resin.

\* \* \* \* \*